United States Patent [19]

Lackey, Jr. et al.

[11] Patent Number: 4,580,524

[45] Date of Patent: Apr. 8, 1986

[54] PROCESS FOR THE PREPARATION OF FIBER-REINFORCED CERAMIC COMPOSITES BY CHEMICAL VAPOR DEPOSITION

[75] Inventors: Walter J. Lackey, Jr., Oak Ridge; Anthony J. Caputo, Knoxville, both of Tenn.

[73] Assignee: The United States of America as represented by the United States Department of Energy, Washington, D.C.

[21] Appl. No.: 648,398

[22] Filed: Sep. 7, 1984

[51] Int. Cl.[4] .............................................. C23C 16/46
[52] U.S. Cl. ................................... 118/725; 118/724; 118/732; 118/733; 427/237; 427/255.2
[58] Field of Search .............. 118/724, 725, 732, 728, 118/715, 733; 427/255.2, 243, 237

[56] References Cited

U.S. PATENT DOCUMENTS

| | | | |
|---|---|---|---|
| 1,954,995 | 4/1934 | Harrison | 118/724 X |
| 2,508,509 | 5/1950 | Germer et al. | 118/715 |
| 2,847,319 | 8/1958 | Marvin . | |
| 3,075,494 | 1/1963 | Toulmin, Jr. . | |
| 3,160,517 | 12/1964 | Jenkin . | |
| 3,231,409 | 1/1966 | Munters | 427/243 X |
| 3,589,953 | 2/1968 | Traxler | 118/900 X |
| 3,991,248 | 11/1976 | Bauer | 427/249 X |
| 4,123,989 | 11/1978 | Jewett | 427/86 X |
| 4,134,360 | 1/1979 | Fisher et al. | 118/728 |
| 4,186,684 | 2/1980 | Intrater et al. | 118/725 |

FOREIGN PATENT DOCUMENTS

| | | | |
|---|---|---|---|
| 471232 | 1/1951 | Canada | 118/715 |
| 53-41832 | 11/1978 | Japan | 427/243 |

OTHER PUBLICATIONS

Pierson, H. O., "Boron Nitride Composites by CVD," *J. Composite Materials*, vol. 9, Jul. 1975, pp. 228-240.
Christin, F., et al., "A Thermodynamic and Experimental Approach of SIL-CVD Application to the CVD-Infiltration of Porous Carbon-Carbon Composites," *Seventh Intl. Conf. on CVD*, 1979, pp. 499-514.
Gebhart, J. J., "CVD Boron Nitride Infiltration of Fiborous Structures: Properties of Low Temp. Deposits", *4th Intl. Conf. on CVD*, Boston, 1973, pp. 460-471.
Newkirk et al., "Preparation of Fiber Reinforced Titanium Diboride and Boron Carbide Composite Bodies", *Seventh Intl. Conf. on CVD* (1979), pp. 515-517, 520 and 521.
Newkirk et al., "CVD Fabrication of Filament-Reinforced Composites for High Temp. Applications", *Chemically Vapor Deposited Coatings*, American Ceramic Soc. (1981), pp. 84,86,88,90,92,94,96,98,100.
Pfieter et al., "Consolidation of Composite Structures by CVD," *2nd Intl. Conf. on CVD*, Los Angeles, May 10-15, 1970, The Electrochemical Society, pp. 463,466,467,470,471,474,475,478,479,482 and 483.
Kotlensky, et al., "SiC Oxidation Protection Coatings for Carbon/Carbon Composites", *The 3rd Intl. Conf. on CVD* Salt Lake City, Utah, Apr. 24-27, 1972, American Nuclear Society, pp. 573,575,577,579,581,583,585,587 and 589.

*Primary Examiner*—Bernard F. Plantz
*Attorney, Agent, or Firm*—Earl L. Larcher; Stephen D. Hamel; Judson R. Hightower

[57] ABSTRACT

A chemical vapor deposition (CVD) process for preparing fiber-reinforced ceramic composites. A specially designed apparatus provides a steep thermal gradient across the thickness of a fibrous preform. A flow of gaseous ceramic matrix material is directed into the fibrous preform at the cold surface. The deposition of the matrix occurs progressively from the hot surface of the fibrous preform toward the cold surface. Such deposition prevents the surface of the fibrous preform from becoming plugged. As a result thereof, the flow of reactant matrix gases into the uninfiltrated (undeposited) portion of the fibrous preform occurs throughout the deposition process. The progressive and continuous deposition of ceramic matrix within the fibrous preform provides for a significant reduction in process time over known chemical vapor deposition processes.

8 Claims, 4 Drawing Figures

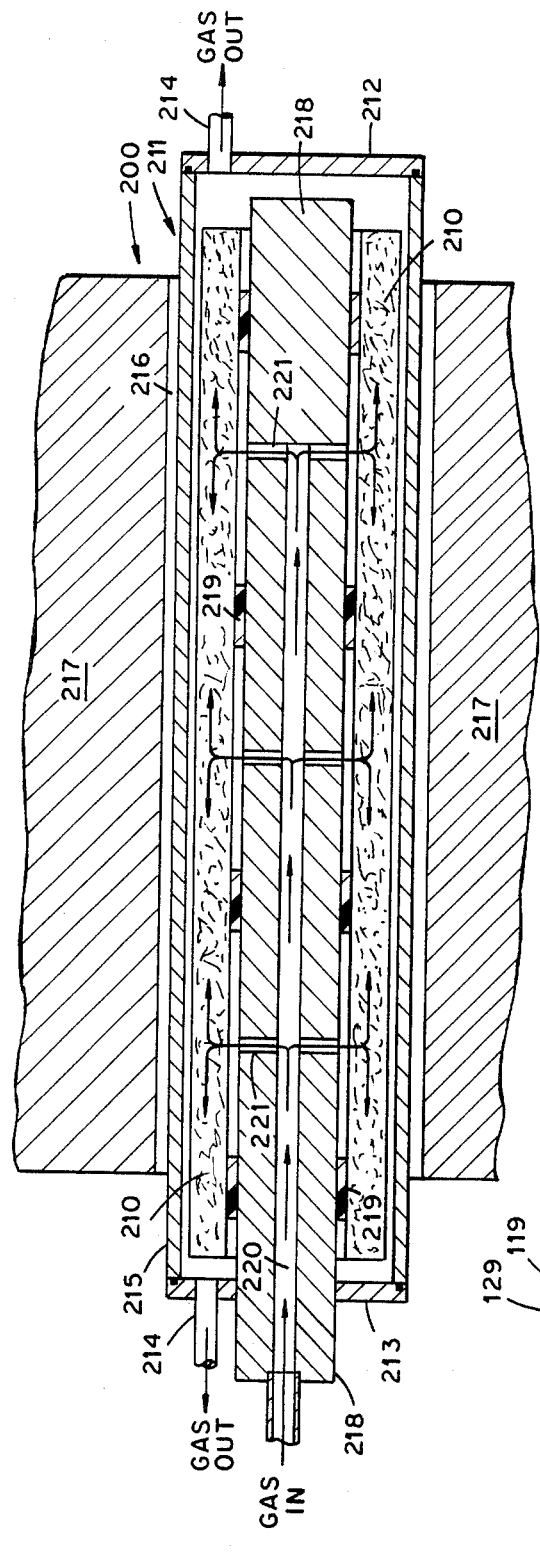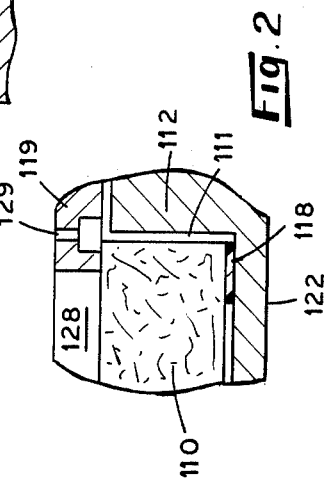

PROCESS FOR THE PREPARATION OF FIBER-REINFORCED CERAMIC COMPOSITES BY CHEMICAL VAPOR DEPOSITION

The U.S. Government has rights in this invention pursuant to Contract No. DE-W-7405-eng-26 between the U.S. Department of Energy and Union Carbide Corporation, Nuclear Division.

BACKGROUND OF THE INVENTION

1. Field of the Invention and Contract Statement

The invention relates to chemical vapor deposition processes and to apparatus for conducting such chemical vapor deposition processes.

2. Discussion of Background and Prior Art

In recent years, ceramics have been the focus of considerable attention for use in advanced energy conversion systems, such as, heat exchangers, gas turbines and other heat engines. The low fracture toughness of conventional ceramics is a severe limitation to their use in a number of applications. Considerable work has been carried out over the last twenty years in the development of fiber-reinforced ceramics in an attempt to improve ceramic toughness. It has become well known that the toughness of some ceramics can be increased appreciably by reinforcement with high strength fibers. However, conventional ceramic fabrication procedures, which generally involve pressing and heating at high temperatures, tend to damage reinforcing fibers and result in significant reduction in fiber strength. In order to overcome such problem, chemical vapor deposition (CVD) processes have been developed whereby fibrous forms are subjected to infiltration by reactant gaseous materials which, under controlled conditions, react to form a ceramic matrix on and around the fibers. Thereby a fiber-toughened ceramic composite is provided without any damage to the fibers. There are shortcomings in such chemical vapor deposition processes. Some of the chemical vapor deposition processes use a flow of gaseous material around a heated fibrous form and depend on diffusion to transport the reactant gases into the fibrous form. Newkirk, L. R., et al., "Preparation of Fiber Reinforced Titanium Diboride and Boron Carbide Composite Bodies", *Seventh International Conference on Chemical Vapor Deposition*, (1979), p. 515; Pierson, H. O., "Boron Nitride Composites by Chemical Vapor Deposition", *J. Composite Materials*, Vol. 9 (July 1975), p. 228; Newkirk, L. R., et al., "Chemical Vapor Deposition Fabrication of Filament-Reinforced Composites for High Temperature Applications", *Chemically Vapor Deposited Coatings*, The American Ceramic Society, (1981), p. 82. Diffusion, in such case, is slow—that is, days, and even weeks, are required for sufficient infiltration to occur. Other prior art processes using chemical vapor deposition techniques make use of an apparatus in which fibers are packed in a heated tube with the reactant gases flowing through the fibrous pack. Pfiefer, W. H. et al., "Consolidation of Composite Structures by CVD", *Second International Conference on Chemical Vapor Deposition*, Los Angeles, Calif., May 10-15, 1970, The Electrochemical Society, New York, N.Y., (1970), p. 463; Kotlensky, W. V., et al., "Silicon Carbide Oxidation Protection Coatings for Carbon/Carbon Composites", *The Third International Conference on Chemical Vapor Deposition*, Salt Lake City, Utah, Apr. 24-27, 1972, The American Nuclear Society, Hinsdale, Ill. (1972), p. 574; Christin, F., et al., "A Thermodynamic and Experimental Approach of Silicon Carbide-CVD Application to the CVD-Infiltration of Porous Carbon-Carbon Composites", *Seventh International Conference on Chemical Vapor Deposition*, (1979), p. 499; Gebhardt, J. J., "CVD Boron Nitride Infiltration of Fibrous Structures: Properties of Low Temperature Deposits", *Fourth International Conference on Chemical Vapor Deposition*, Boston, Mass., Oct. 8-11, 1973, The Electrochemical Society, Princeton, N.J. (1973), p. 460. However, the gas flow is stopped as soon as sufficient deposition occurs at the fiber pack surface to plug the gas flow path, leaving much of the fiber pack uninfiltrated. A faster, more efficient chemical vapor deposition fiber-infiltration process is needed.

U.S. Pat. No. 3,160,517 (Jenkin) discloses depositing metals and metallic compounds throughout the pores of a porous body, one side of which is (infrared) heated to give a temperature gradient and plating gas being forced through from the other side. The plating gas must contain at least a portion of one of the decomposition products so as to initially suppress the decomposition reaction in order not to block the pore entrances.

U.S. Pat. No. 2,847,319 (Marvin) discloses process and apparatus for impregnating a porous body (e.g., SiC) with metal (e.g., Ni from Ni carbonyl). The body is heated, then its exterior is cooled so that decomposition occurs only in the heated interior. The decomposable gas is passed from the exterior to the interior of the porous body.

U.S. Pat. No. 4,186,684 (Intrater et al.) discloses vapor deposition apparatus with coolant chambers and a heated substrate support. Coolant is used to cool the reaction chamber.

U.S. Pat. No. 4,123,989 (Jewett) discloses a silicon deposition reaction chamber for producing high-purity Si by depositing it in a Si tube within a heating muffle. Both pyrolysis and hydrogen reduction are used.

U.S. Pat. No. 3,991,248 (Bauer) discloses fiber reinforced carbon/graphite composites, formed by a first bonding of fibers with a pyrolytic coating and then "densifying" them by further infiltration with pyrolytic material. See the comment at col. 12, lines 28 to 34, that it may be necessary for high densities to adjust deposition temperatures, gas flow rates, etc., to insure uniform densification.

U.S. Pat. No. 3,075,494 (Toulmin) discloses apparatus for making internally metallized porous ceramic refractory material, which is uniformly heated by lamps (col. 2, line 33) during deposition. A thermal gradient scheme is not used.

SUMMARY OF THE INVENTION

An object of the invention is to provide a chemical vapor deposition method for faster and more efficient infiltrating of a fibrous form with a ceramic matrix. A further object is to provide such a process whereby the ceramic material is integrated into the fibrous structure. It is another object of the invention to provide an apparatus to perform such chemical vapor deposition method. Other objects and advantages of the invention are set out herein or are obvious herefrom to one ordinarily skilled in the art.

The objects and advantages of this invention are achieved by the improved chemical vapor deposition method and improved apparatus of the invention.

To achieve the foregoing and other objects and in accordance with the purpose of the invention, as embodied and broadly described herein, the invention involves a process for the formation of a fiber-reinforced ceramic composite by chemical vapor deposition. The process includes providing a fibrous preform with oppositely-located hot and cold surfaces, thereby creating a steep thermal gradient across the fibrous preform. A flow of a reactant gas is directed into the fibrous preform through the cold surface thereof. The reactant gas completely infiltrates the entire fibrous preform, first preferentially reacting at and depositing on the fibers in the region of the hot surface of the fibrous preform. The reactant gas progressively deposits on the fibers across the fibrous preform from the hot surface to the cold surface the flow of reactant gas into the as yet undeposited portion of the fibrous preform continuing during the deposition.

Preferably the fibrous preform are composed of SiC fibers. One preferred reactant gas is composed of $CH_3Cl_3Si$ in gaseous form and an excess molar amount of $H_2$. Such reactant gas is used at a temperature of 1100° to 1400° C. Another preferred reactant gas is composed of $SiCl_4$ in gaseous form, $NH_3$ in gaseous form and an excess molar amount of $H_2$, the molar ratio of $SiCl_4$ to $NH_3$ being about 3 to about 4. Such reactant gas is used at a temperature of 1000° to 1400° C.

The invention also involves fiber-reinforced ceramic composites prepared by the invention process. Of preference are fiber-reinforced ceramic composites, prepared by the invention process, comprised of SiC fibers with a chemically vapor deposited SiC matrix, or comprised of SiC fibers with a chemically vapor deposited $Si_3N_4$ matrix.

The fibrous form to be infiltrated is held within specially-designed apparatus which provides heat to one surface (face) of the form and provides water cooling to the opposite surface (face) and outer edges of the fibrous preform. Thereby, a steep or large thermal gradient is created across the preform. A flow of reactant gases is directed into the fibrous form at the cold face. The flow of reactant gases progresses through the form, and begins to preferentially react and deposit at the hot surface. The steep thermal gradient across the thickness of the fibrous preform allows deposition of the ceramic matrix to occur progressively from the hot surface toward the cold surface and edges. This progressive infiltration and deposition allows the gases to continue to flow because the cooler outer edges do not become plugged. The flow of reactant gases into the uninfiltrated portion of the fibrous preform is continuous throughout the deposition process. The invention process permits the attainment of high matrix densities within a significantly shorter time than with prior art chemical vapor deposition processes and apparatus.

The invention process can be used to prepare fiber reinforced ceramic composite materials for military applications, such as, rocket and jet engine combustion chambers, and nose cones for space and weapons vehicles. Commercial or industrial applications of the invention fiber-toughened ceramics include heat engine and turbine components, heat exchanger tubes, and pump and valve components for high-temperature erosive-environment service. The invention involves apparatus for performing vapor deposition on a fibrous or porous substrate. The apparatus includes a housing having a chamber with an opening at one end thereof, and means for mounting the fibrous substrate in the opening of the housing chamber. There are heating means in association with the housing chamber for heating the side of the fibrous substrate facing into the housing chamber, cooling means for cooling the side of the fibrous substrate facing away from the housing chamber, and means for providing a flow of reactant gas to the cooled side of the fibrous substrate. The heating means and the cooling means, when in use, create a temperature gradient across the fibrous substrate. There is also means for exhausting the gases exiting the heated side of the fibrous substrate from the housing chamber.

Preferably the heating means is a graphite heater positioned around the housing chamber. Also, preferably the cooling means is a water circulation system. The fibrous substrate is preferably in the form of a flat layer.

The invention further involves apparatus for performing vapor deposition on a fibrous or porous substrate having a tubular shape. The apparatus includes a tubular housing having a chamber with the ends thereof closed, one of the ends being removable and one of the ends having a hole therein. The tubular housing is adapted to contain the tubular subtrate therein with a space between the outer surface of the tubular substrate and the inner surface of the tubular housing. Gas injection means is positioned within the tubular housing so as to be within the tubular substrate and extends through the hole in one end of the tubular housing. The gas injection means is adapted to provide a space between the outer surface of the gas injection means and the inner surface of the tubular substrate.

There are cooling means for cooling the gas injection means, thereby cooling the internal side of the tubular substrate, and heating means for heating the longitudinal portion of the tubular housing, thereby heating the external side of the tubular substrate. The heating means and the cooling means, when in use, create a temperature gradient across the fibrous substrate. There is also means for exhausting the gases exiting the heated side of the tubular substrate from the tubular housing.

Preferably the tubular housing, the tubular substrate and the gas injection means each have a circular lateral cross-section. Also, preferably the heating means is a furnace and the housing is made of a refractory material, and preferably the cooling system is a water circulation system. The gas injection means preferably has a longitudinal central gas passageway and at least one radial gas passageway in communication with the central passageway and the outside of the gas injection means.

Reference will now be made in detail to the present preferred embodiments of the invention, examples of which are illustrated in the accompanying drawings.

A BRIEF DESCRIPTION OF THE DRAWINGS

The accompanying drawings, which are incorporated in and form a part of the specification, illustrate the invention and, together with the description, serve to explain the principles of the invention. In the drawings:

FIG. 2 is a longitudinal cross-sectional view of the venting means around the fibrous substrate (or preform) in the apparatus of FIG. 1;

FIG. 4 is a longitudinal cross-sectional view of an alternate embodiment of the invention apparatus by which hollow cylindrical-shaped fiber forms are infil-

DETAILED DESCRIPTION OF THE INVENTION

All parts, percentages, ratios and proportions are on a weight basis unless otherwise stated herein or obvious herefrom to one ordinarily skilled in the art.

Figure 1:
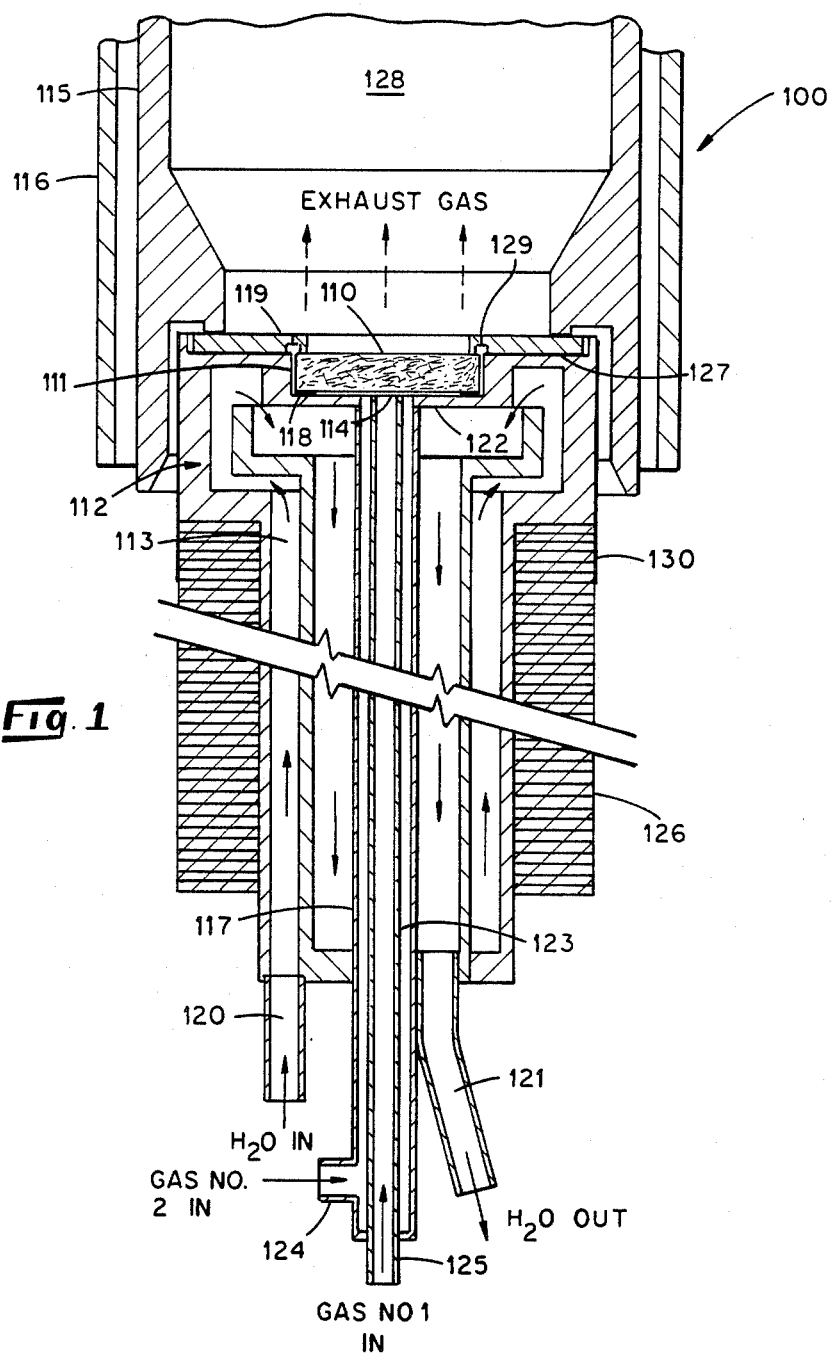
FIG. 1 is a longitudinal cross-sectional view of the chemical-vapor deposition apparatus of the invention.

Referring to FIG. 1, a preferred embodiment is disclosed which shows a preferred version of invention apparatus 100 being used to conduct a preferred version of the invention chemical vapor deposition process.

Fibrous form 110 is positioned in circular well 111 in the top surface of water-cooled cylindrical metal holder 112. Cooling is provided to the bottom surface and outer edges of fibrous form 110 by water circulating in a jacketed lower section of holder 113. Water inlet 120 and water outlet 121 are utilized. As seen in FIG. 1, cooling surface 122 provides the above-mentioned cooling. Graphite exhaust tube 115, surrounding fibrous form 110 and extending upward from the top of holder 113, directs exhaust gases from apparatus 100. Heat is supplied to the top surface of fibrous form 110 by means of cylindrical graphite heater 116 positioned outside of and surrounding exhaust tube 115. The reactant gases (ceramic matrix materials) are directed into fibrous form 110 by way of dual (concentric) gas conduit tubes 117 and 123 extending through the bottom of holder 113, and communicating with the bottom surface of fibrous form 110 through an opening 114 in the bottom of well 111. Line 117 has side port 124, and line 123 has bottom port 125. Reactant gases flow through fibrous form 110 and, when sufficiently heated (near the top of the form), the chemical vapor deposition reaction occurs. As a result, fibers 110 are coated and surrounded by the reaction product to form the matrix of the invention composite. The higher the temperature, the more rapid the deposition; therefore, the infiltration occurs progressively from the top of fibrous form 110 toward the bottom. Grafoil seal 118 forces the reactant gases to flow into fibrous form 110. (Grafoil is 0.010 thick sheets of highly anisotropic graphite grade GTB sold by Union Carbide Corporation.) Gases passing through preform 110 are exhausted out chamber 128. When the top surface region becomes coated over, the gases flow up into fibrous form 110 then radially through fibrous form 110 to the angular void space around form 110 and then escape through passageway 129 in vented retaining ring 119. (see FIG. 2.) Carbon felt insulation 126 surrounds the lower end of holder 113. Grafoil seal 127 is used between vented retaining ring 119 and the top of holder 113. Also, Grafoil insulation 130 is used around the top side portion of holder 113.

THE EXAMPLE

The invention process has been applied to two chemical systems, namely:

(1) SiC fibers with a chemically vapor deposited SiC matrix; and (2) SiC fibers with a chemically vapor deposited $Si_3N_4$ matrix. A total of about 24 runs were made, namely, twelve with a SiC matrix and twelve with a $Si_3N_4$ matrix. To deposit SiC only, one gas inlet tube 117 is needed; but for $Si_3N_4$, two tubes 117 (see FIG. 1) are required since the $NH_3$ and $SiCl_4$ reactant gases must be kept separated until the gases enter the region where deposition is desired. Otherwise, premature deposition occurs which plugs the gas inlet line.

Figure 3:
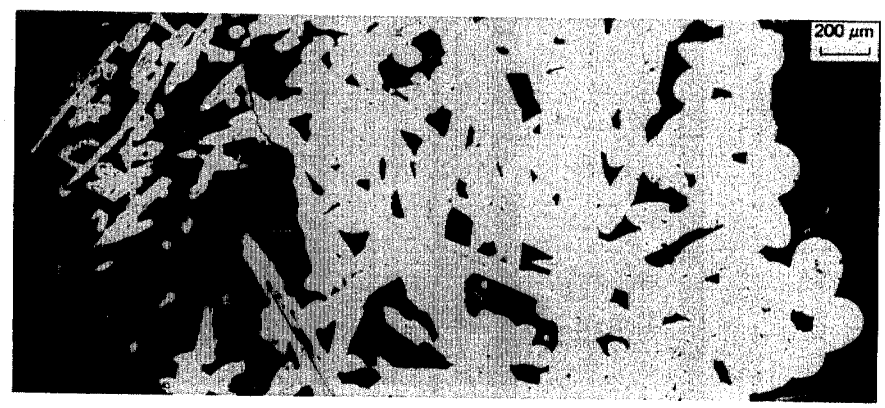
FIG. 3 is a photomicrograph of a metallographically polished section of composite of SiC fiber and chemical-vapor-deposited $Si_3N_4$ matrix prepared by the invention process.

A metallographically polished section of a composite of SiC fiber and chemically vapor deposited $Si_3N_4$ matrix prepared by the invention apparatus and process is shown in FIG. 3. The matrix was deposited at a maximum temperature of 1300° C. in the presence of excess hydrogen according to the following reaction:

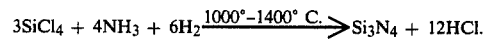

$$3SiCl_4 + 4NH_3 + 6H_2 \xrightarrow{1000°-1400° C.} Si_3N_4 + 12HCl.$$

The upper portion of FIG. 3 corresponds to the top or hotter portion of the fibrous form and thus deposition occurred progressively from this surface toward the bottom. The total time for the run was 3 hours. Fibers of SiC surrounded by thick chemically vapor deposited $Si_3N_4$ deposits are visually evident. Similar specimens containing a chemically vapor deposited SiC matrix were prepared according to the following reaction:

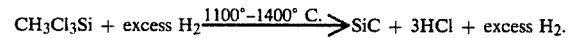

$$CH_3Cl_3Si + \text{excess } H_2 \xrightarrow{1100°-1400° C.} SiC + 3HCl + \text{excess } H_2.$$

All of the fibrous preforms were prepared by vacuum-slurry-molding of Nicalon SiC fibers. Fibrous forms prepared by other methods, such as, stacking of multiple layer of cloth, paper and felt or filament wound structures, can also be used.

Mechanical property testing was performed. Three specimens (0.1 inch square by 1 inch long) were cut from an infiltrated disk like that shown in FIG. 3 and evaluated by 4-point fluxural testing. Two of the three specimens exhibited the desired ability to carry a load after crack initiation, i.e., the stress-strain curve exhibited much more strain, as desired, than typical non-reinforced ceramics.

The process time is reduced by an order of magnitude or more over known prior art methods because of the forced reactant gas flow through the fibrous form. The prior art made use of either thermal gradient or forced flow or combined thermal gradient and forced flow in a limited sense. The invention allows the simultaneous use of forced flow and a thermal gradient which avoids the problem of plugging. Thus, gas can flow through the uninfiltrated portion of the fibrous form throughout the duration of the invention process. The prior art embodiments suffer from reduced flows, except during the intial portion of the process, i.e., plugging gradually reduced flows.

A preferred alternative version of the invention apparatus is shown in FIG. 4. Apparatus 200 and the process permit the chemical vapor deposition infiltration of fibrous forms 210 in the shape of tubes or hollow cylinders, with a ceramic matrix. Fibrous tube 210 is positioned in refractory furnace tube 211, which has ends 212 and 213. Gas outlets 214 are located in ends 212 and 213. Fibrous tube 210 does not touch the inside surface of cylindrical portion 215 of tube 211. Refractory furnace tube 211 is positioned in port 216 of furnace 217. Gas distributor 218 is water-cooled metal and fits within tubular preform 210. Gas seals 219 separate injector 218 from tubular preform 210 and serve as gas blocks. The infiltration is assisted by simultaneous forced reactant gas flow and the presence of a steep temperature gradient. The inside cylindrical surface of the fibrous preform is cooled by a water-cooled gas injector 218. One end of injector 218 extends through end 213 of tube 211. Gas flows through central passageway 220 and out radial passageways 221. Reactant gas flows from injector 218 through the wall of fibrous preform 210. The outer cylindrical surface of fibrous preform 210 is heated by furnace 217. When the reactant gases approach such surface, they react resulting in deposition of the matrix on the fibers. Product gases and any unreacted gases flow axially through the fibrous form and exit at either end of tube 211.

Extension of the invention infiltration concept to tubular geometries is of very signicant technical and industrial importance. Many industrial products, such as heat exchanger tubes and diesel engine cylinder liners, can be fabricated using the apparatus of FIG. 4.

Although the above experimental data only involves SiC fibers with either chemically vapor deposited SiC or $Si_3N_4$ matrices, the invention process is also applicable for use with other ceramic, carbon or metal fibers. The chemically vapor deposited matrix can be either ceramic or metallic. Other examples of the ceramic or metallic material are silicon nitride, boron nitride, titanium tantalum, tungsten, molybdenum, columbium, tantalum carbide, niobium carbide, zirconium carbide, hafnium carbide, tungsten carbide, titanium carbide and silicon carbide. The fibrous form which is reaction gas infiltrated can be slurry molded fibers, multiple layers of cloth, paper or felt, or a filament wound structure.

By way of summary, the invention involves a process for the formation of fiber-reinforced ceramic composites by directing a flow of reactant gas from which ceramic matrix material can be deposited at the cold face of a fibrous preform, which is being provided with a hot face opposite of a cold face. The preform is located in an apparatus which provides a steep thermal gradient across the thickness of the preform. The deposition occurs progressively from the hot face to the cold face. The flow of reactant gas into the uninfiltrated portion occurs throughout the deposition process. The invention apparatus has a void space around the fibrous preform and a vented retaining ring for escape of excess reactive gas. The apparatus can also be adapted for a tubular form of a fibrous preform.

The foregoing description of preferred embodiments of the invention has been presented for purposes of illustration and description. It is not intended to be exhaustive or to limit the invention to the precise form disclosed, and obviously many modifications and variations are possible in light of the above teachings. The embodiments were chosen and described in order to best explain the principles of the invention and its practical application to thereby enable one skilled in the art to best utilize the invention in various embodiments and with various modifications as are suited to the particular use contemplated. It is intended that the scope of the invention be defined by the claims appended hereto.

What is claimed is:

1. Apparatus for performing vapor deposition on a fibrous or porous substrate, comprising:
   (a) a housing having a chamber with an opening at one end thereof;
   (b) means for mounting a porous or fibrous substrate having opposite surfaces and outer edges in said opening in the housing chamber with said outer edges spaced from said housing for defining therewith a gas receiving void in registry with said housing chamber;
   (c) heating means in association with the housing chamber for heating the surface of the fibrous substrate facing into the housing chamber;
   (d) cooling means for cooling the surface of the fibrous substrate facing away from the housing chamber;
   (e) means for providing a flow of reactant gas to the cooled surface of the fibrous substrate;
   (f) seal means disposed between said housing and the cooled surface of the substrate for conducting the reactant gas into said substrate; and
   (g) means exhausting from the housing chamber the gases exiting the heated surface of the fibrous substrate during initial phases of the vapor deposition and then from the edges of the substrate through said gas receiving void from the housing chamber, the heating means and the cooling means, when in use, creating a temperature gradient across the fibrous substrate.

2. Apparatus as claimed in claim 1 wherein the cooling means is a water circulation system.

3. Apparatus as claimed in claim 1 wherein the fibrous substrate is in the form of a flat layer.

4. Apparatus for performing vapor deposition on a fibrous or porous substrate having a tubular shape, comprising:
   (a) a tubular housing having a chamber with the ends thereof closed, one of the ends being removable and one of the ends having a hole therein, the tubular housing be adapted to contain a tubular substrate therein with a space both between the outer surface of the tubular substrate and the inner surface of the tubular housing and between opposite ends of the substrate and said closed ends of the chamber;
   (b) gas injection means positioned within the tubular housing so as to be within the tubular substrate and extending through the hole in one end of the tubular housing, the gas injection means being adapted to provide a space between the outer surface of the gas injection means and the inner surface of the tubular substrate;
   (c) seal means in said space between the gas injection means and the inner surface of the tubular substrate for directing gases from the gas injected means radially into said substrate;
   (d) cooling means for cooling the gas injection means, thereby cooling the internal side of the tubular substrate;
   (e) heating means for heating the longitudinal portion of the tubular housing, thereby heating the external side of the tubular substrate; and
   (f) means for exhausting gases exiting the heated side and said opposite ends of the tubular substrate from the tubular housing,
   the heating means and the cooling means, when in use, creating a temperature gradient across the fibrous substrate.

5. Apparatus as claimed in claim 4 wherein the tubular housing, the tubular substrate and the gas injection means each has a circular lateral cross-section.

6. Apparatus as claimed in claim 4 wherein the heating means is a furnace and the housing is made of a refractory material.

7. Apparatus as claimed in claim 4 wherein the cooling system is a water circulation system.

8. Apparatus as claimed in claim 4 wherein the gas injection means has a longitudinal central gas passageway and at least one radial gas passageway in communication with the central passageway and the outside of the gas injection means.

* * * * *